United States Patent [19]

Cann

[11] 4,104,594
[45] Aug. 1, 1978

[54] MODIFIED A. M. DETECTOR
[75] Inventor: Alfred J. Cann, Wilton, N.H.
[73] Assignee: Sanders Associates, Inc., Nashua, N.H.
[21] Appl. No.: 719,560
[22] Filed: Sep. 1, 1976
[51] Int. Cl.² .......................... H04B 1/12; H03D 1/04
[52] U.S. Cl. .................................. 325/475; 325/477; 325/480; 325/487; 329/206
[58] Field of Search ............... 325/472, 473, 474, 475, 325/477, 480, 484, 487; 329/203–206, 146, 147

[56] References Cited
U.S. PATENT DOCUMENTS

| | | | |
|---|---|---|---|
| 2,263,165 | 11/1941 | Dallos | 325/473 |
| 3,057,995 | 10/1962 | Thaler | 325/477 |
| 3,094,665 | 6/1963 | Wildman | 329/204 |
| 3,401,341 | 9/1968 | Kahn | 329/147 |

Primary Examiner—Robert L. Griffin
Assistant Examiner—Marc E. Bookbinder
Attorney, Agent, or Firm—Louis Etlinger; Richard I. Seligman

[57] ABSTRACT

Reduction of interference from off-frequency signals in an a.m. receiver is achieved by substituting an average detector for the conventional peak detector employed in such receivers. Conversely, enhancement of off-frequency signal reception is achieved by employing an average detector in parallel with a peak detector with their outputs subtracted.

13 Claims, 7 Drawing Figures

MODIFIED A. M. DETECTOR

BACKGROUND OF THE INVENTION

This invention relates to detectors for a.m. receivers and more particularly to the use of average detectors in place of the conventional peak detectors or in conjunction therewith.

When interference is present in a.m. receivers in the form of an off-frequency a.m. signal, somewhat weaker than the desired signal, three kinds of interference will appear in the detector output. The strongest will be the beat between the two carrier frequencies. This "carrier squeal" may or may not be important, depending upon whether it is within the audio band or above it. The second strongest will be the demodulation of the sidebands of the weaker signal with the carrier of the stronger. Since all the frequencies are wrong, this is generally not intelligible and is called "monkey chatter". Third will be the demodulation of these sidebands with their own carrier. Since this will be intelligible, it may cause more real interference with the intelligibility of the desired message.

The interfering signal will cause a carrier beat which will be modulated with the modulation of the interfering signal plus that of the desired signal. The peak detector of a conventional a.m. receiver will follow this modulation, thus, providing the intelligible intereference to the listener.

Conversely, in some situations (called conferencing) the listener desires to hear off-frequency signals, in which case one wishes to enhance the effect described above and reduce the volume of the output due to the strongest signal.

SUMMARY OF THE INVENTION

Accordingly, it is an object of this invention to provide an improved a.m. detector.

It is another object of this invention to provide an a.m. detector for a receiver having improved interference suppression.

It is a further object of this invention to provide an a.m. receiver to enhance the reception of multiple signals.

Briefly, interference suppression is achieved by providing an average detector in substitution for the conventional peak detector in an a.m. receiver such that the detector will output the modulation of the strongest signal.

In an alternate embodiment, an average detector is provided in parallel with the conventional peak detector in an a.m. receiver so as to provide the ability to hear more than one signal at any time. The signals from the average detector and peak detector are subtracted from one another. This will suppress to a degree the strongest signal allowing many more signals to be heard.

BRIEF DESCRIPTION OF THE DRAWINGS

The above-mentioned and other features and objects of this invention will become more apparent with reference to the following description taken in conjunction with the accompanying drawings, in which.

DESCRIPTION OF THE PREFERRED EMBODIMENTS

Figure 1:
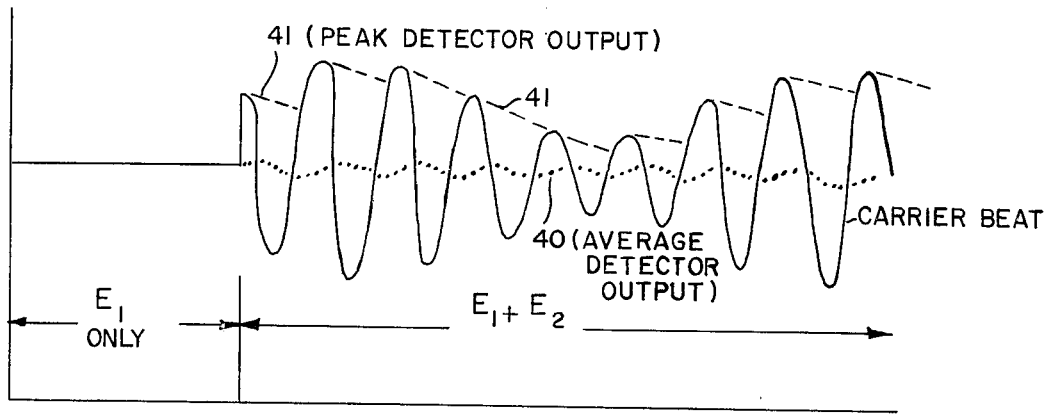
FIG. 1 is a waveform illustrating principles of the present invention.

In a conventional a.m. receiver employing a peak detector, interference may be present from other signals. Particularly troublesome is the intelligible demodulation of interfering signals. FIG. 1 shows how intelligible demodulation of a weaker signal occurs in a peak detector. This figure shows the envelope of the i.f. signal consisting of a strong unmodulated signal $E_1$ plus a weaker modulated signal $E_2$. In the case shown here the carrier beat frequency is above the corner frequency of the r.f. filter on the detector. This corresponds to the case of interest, in which the carrier beat frequency is high enough not to constitute serious intereference by itself. Note that the beat is amplitude modulated by the modulation of $E_2$. As shown by dashed line 41, the detector output, instead of following the beat cycles, approximately follows their envelope. Hence the modulation of $E_2$ is reproduced. If $E_1$ were also modulated, the output would contain the sum of the two modulations.

Figure 2:
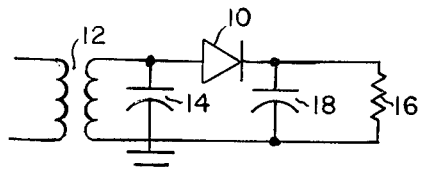
FIGS. 2 and 3 are schematics of prior art a.m. detection circuits.

Conventional a.m. receivers employ a peak detector as shown in FIG. 2. The detector typically consists of a diode 10, capacitor 18 and load 16. The detector is coupled to the output of the i.f. portion of the receiver comprising the last i.f. transformer 12 and tuning capacitor 14. In a common variant of the circuit of FIG. 2 the cathode of diode 10 is coupled to ground. This type of circuit is particularly employed in vacuum tube circuits where it is required that the cathode be at ground potential. Such a circuit when used in an a.m. receiver can occasion a certain amount of interference from off-frequency signals as described above.

Figure 4:
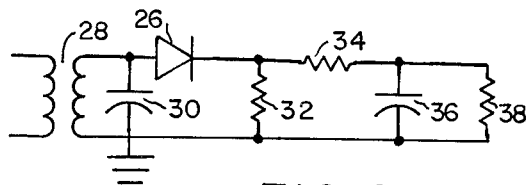
FIGS. 4 and 5 are schematics of a.m. detection circuits according to the present invention.

Referring now to FIG. 4 of the drawings there is illustrated thereby a detector circuit for suppressing interference in an a.m. receiver. The circuit is an average detector. It includes a diode 26 coupled to the last i.f. stage of an a.m. receiver comprising an i.f. transformer 28 and tuning capacitor 30. The other end of diode 26 is coupled to a pair of resistors 32 and 34. The other end of resistor 32 is coupled to ground while the other end of resistor 34 is coupled to a capacitor 36. The other end of capacitor 36 is grounded. A resistor 38 is shunted across capacitor 36 representing the load on the circuit. Resistor 32 comprises the load resistor for diode 26 and resistor 34 and capacitor 36 comprise a low-pass filter which removes the carrier ripple. Resistor 34 also isolates diode load resistor 32 from capacitor 36 such that the diode load will be nearly a purely resistive load. In this circuit in order to eliminate any tendency toward peak detection certain precautions should be taken. Resistor 32 must have a value much smaller than resistor 34 so that the load seen by the diode is essentially resistive. The load resistor 38 will generally be of the same order of magnitude as resistor 34.

Although the discussion relates to detection at i.f., the principles are equally applicable to detection at r.f.

The above analysis is based on the assumption of a perfectly linear diode, however, a real diode will be somewhat between linear and square law. In the latter case the response to the beat cycles will not be perfectly symmetrical, the upward half cycles having more effect on the diode current than the downward half cycles. Thus, a small amount of the a.m. will be reproduced. To minimize this effect, several measures may be taken to "linearize" the diode, e.g.: (1) use of the highest possible i.f. voltage. In a tube set this is no problem. In a transistor set using a low supply voltage a step-up i.f. transformer may be used. (2) Use of a diode with the lowest possible "knee" voltage, e.g., a germanium diode or a "hot carrier" (Schottky) diode. (3) Use of a forward bias to lower the effective diode "knee" voltage. (4) Incorporation of the diode in a feedback loop as taught in U.S. Pat. No. 3,691,465.

Figure 3:
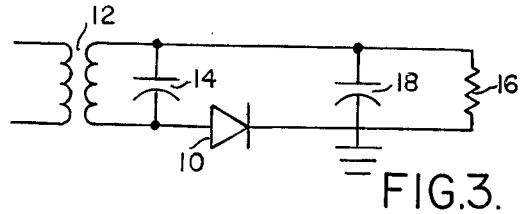

When this circuit is substituted for the peak detectors of FIGS. 2 and 3 in a receiver the output thereof will be like that represented by the dotted line 40 of FIG. 1. The low-pass filter made up of resistor 34 and capacitor 36 has reduced the carrier beat to the ripple of waveform 40. Note that the modulation has not been reproduced. Contrast this to the output of a peak detector in an a.m. receiver represented by the dashed line 41 in FIG. 1.

Figure 5:
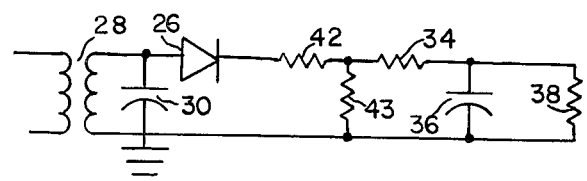

A variation of the circuit of FIG. 4 is shown in FIG. 5 wherein a series resistor 42 is added. This is done to permit more practical resistance values with a standard i.f. transformer. In this circuit the value of resistor 42 is much greater than resistor 43 such that capacitor 36 has little effect on the diode load and it is effectively mostly resistive.

Figure 6:
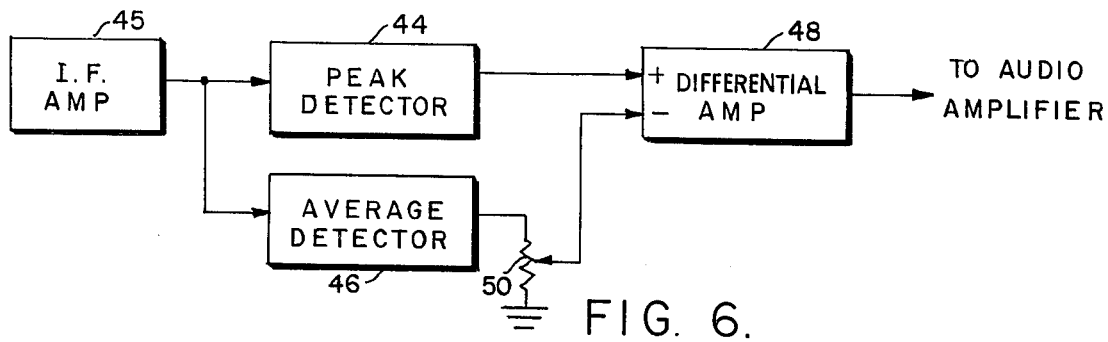
FIG. 6 is a block diagram of an embodiment employing the circuits of both FIGS. 2 and 3 and FIGS. 4 and 5.

While the circuits of FIGS. 4 and 5 have been employed to reduce off-frequency interference the inverse to this is a circuit as shown in FIG. 6 to enhance off-frequency reception which is desirable in some situations. For instance, consider a "conferencing network" or "party-line" situation where break-in is practiced and it may be desirable to hear more than one station simultaneously. An example may be a combat pilot receiving information from the ground and from other aircraft. A very strong signal as from a nearby aircraft may prevent his hearing other simultaneous signals. Thus, if we could reduce the strongest signal making all the signals more nearly the same strength, the pilot could use the "cocktail party effect" to listen to the message he deems most important.

In FIG. 6 the output of the i.f. amplifier 45 of the a.m. receiver is applied to both a peak detector 44 and an average detector 46. The outputs from these circuits are then subtracted in a differential amplifier 48. In this manner the peak detector will output all signals while the average detector only the strongest signal. By subtracting their audio outputs the strongest signal will be suppressed an amount depending upon the setting of an attenuator 50 coupling the average detector 46 to differential amplifier 48. Because of the lossy nature of an average detector many situations will require that the output of the peak detector be attenuated rather than the output of the average detector as shown in FIG. 6.

Figure 7:
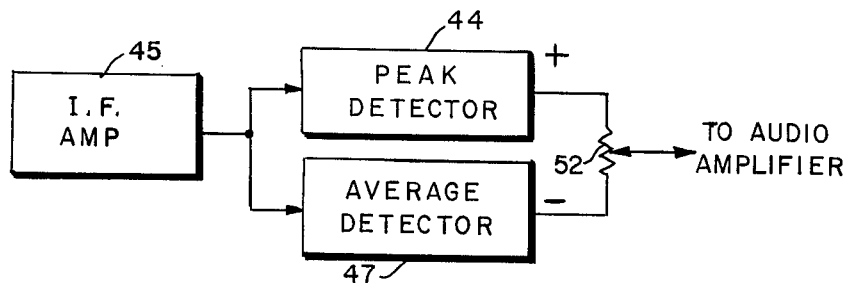
FIG. 7 is a block diagram of a simpler embodiment of the circuit of FIG. 6.

A simpler version of the system of FIG. 6 is shown in FIG. 7 wherein the outputs from the two detectors are applied to a potentiometer 52 instead of a differential amplifier. In this embodiment it is necessary that the diode of average detector 47 be reversed in polarity from that of peak detector 44.

Although the circuits described above are discussed in relation to an a.m. receiver, the principles are applicable to other situations wherein peak detectors are employed such as the detectors employed in frequency discriminators. Further, in addition to use for speech reception, the principles may also be used for reception of data, pictures, radar, sonar, telemetry commands, etc. Thus, it is to be understood that the embodiments shown are illustrative only, and that many variations and modifications may be made without departing from the principles of the invention herein disclosed and defined by the appended claims.

I claim:

1. An a.m. receiver, comprising:
   an input for receiving amplitude modulated desired and interfering signals;
   an average detector coupled to said input, said average detector being used for detecting amplitude modulation on the desired signals while ignoring amplitude modulation on the interfering signals, and having a time constant short compared to the periods of the frequencies of the amplitude modulation; and
   means for utilizing the amplitude modulation of the desired signals, said utilization means being coupled to said average detector.

2. The apparatus as defined in claim 1 wherein said average detector includes a diode detector, a load resistor coupled to said diode detector and a low-pass filter coupled to said load resistor.

3. The apparatus as defined in claim 2 wherein said low-pass filter includes a shunt capacitor and a resistor coupling said diode detector and said load resistor to said shunt capacitor.

4. The apparatus as defined in claim 3 wherein said receiver includes an i.f. section, said average detector being coupled to said i.f. section.

5. The apparatus as defined in claim 4 wherein said coupling resistor has a value very much larger than said load resistor so as to isolate said load resistor from said capacitor thereby making the load presented to the diode nearly purely resistive.

6. The apparatus as defined in claim 1 wherein said average detector includes a diode detector, a diode load including first and second series connected resistors and a low-pass filter coupled to said diode load at the intersection of said first and second series connected resistors, said first resistor being coupled to said diode detector.

7. The apparatus as defined in claim 6 wherein said first resistor has a value very much larger than said second resistor such that the low-pass filter has negligible influence on the diode load impedance.

8. The apparatus as claimed in claim 1, wherein the desired signals are at a desired carrier frequency and the interfering signals are at a different carrier frequency.

9. An a.m. receiver having means for enhancing signals accompanying a desired signal, comprising:
   an input for receiving amplitude modulated desired and other signals;
   an average detector coupled to said input, said average detector being used for detecting amplitude modulation on the desired signals while ignoring amplitude modulation on the other signals, and providing detected output signals in response to all input signals and having a time constant short compared to the periods of the frequencies of the amplitude modulation;
   a peak detector coupled to said input, said peak detector having a time constant short compared to the frequencies of the amplitude modulation;
   means for subtracting the outputs of said average and peak detectors; and means for utilizing the amplitude modulation of the desired and other signals, said utilization means being coupled to said subtraction means.

10. The apparatus as defined in claim 9 wherein said subtracting means includes a differential amplifier.

11. The apparatus as defined in claim 9, further including means for attenuating the output of said average detector.

12. The apparatus as defined in claim 9, further including means for attenuating the output of said peak detector.

13. The apparatus as claimed in claim 9, wherein the desired signals are at a desired carrier frequency and the other signals are at a different carrier frequency.

* * * * *

UNITED STATES PATENT OFFICE
CERTIFICATE OF CORRECTION

PATENT NO. : 4,104,594
DATED : August 1, 1978
INVENTOR(S) : Alfred J. Cann

It is certified that error appears in the above-identified patent and that said Letters Patent are hereby corrected as shown below:

Claim 9, Lines 9 and 10   Delete "providing detected output signals in response to all input signals and"

Line 14   After "tor" insert --providing detected output signals in response to all input signals and--

Line 14   After "the" insert --periods of the--

Signed and Sealed this

Twenty-fourth Day of April 1979

[SEAL]

Attest:

RUTH C. MASON
Attesting Officer

DONALD W. BANNER
Commissioner of Patents and Trademarks